(12) United States Patent
Lee et al.

(10) Patent No.: US 6,258,633 B1
(45) Date of Patent: Jul. 10, 2001

(54) LASER-PROGRAMMABLE INTERCONNECT PROCESS FOR INTEGRATED CIRCUIT CHIPS

(75) Inventors: Rex Alan Lee, Temple Terrace; Wilfrido Alejandro Moreno, Tampa, both of FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 08/888,437

(22) Filed: Jul. 7, 1997

Related U.S. Application Data

(63) Continuation of application No. 08/389,892, filed on Feb. 16, 1995, now abandoned.

(51) Int. Cl.[7] .................................................. H01L 21/82

(52) U.S. Cl. .............................................................. 438/128

(58) Field of Search ...................................... 438/128, 129, 438/130, 131, 132, 598, 600, 601, 618, 620, 622, 637, 638, 661, 662

(56) References Cited

U.S. PATENT DOCUMENTS

| | | | |
|---|---|---|---|
| 4,240,094 | 12/1980 | Mader ..................................... | 357/45 |
| 4,455,495 | 6/1984 | Masuhara et al. ..................... | 307/44 |
| 4,665,295 | 5/1987 | McDavid ............................. | 219/121 |
| 4,810,663 | * 3/1989 | Raffel et al. ........................... | 437/19 |
| 4,872,140 | 10/1989 | Graham et al. ........................ | 365/96 |
| 4,910,418 | 3/1990 | Graham et al. ....................... | 307/465 |
| 4,912,066 | * 3/1990 | Willis ..................................... | 437/19 |
| 4,937,475 | 6/1990 | Rhodes et al. ........................ | 307/465 |
| 5,049,969 | 9/1991 | Orbach et al. .......................... | 357/51 |
| 5,231,050 | * 7/1993 | Boudou et al. ............... | 148/DIG. 93 |
| 5,281,553 | * 1/1994 | Boudou et al. ............... | 148/DIG. 93 |
| 5,861,325 | * 1/1999 | Bernstein .............................. | 438/131 |

FOREIGN PATENT DOCUMENTS 62-88338 * 4/1987 (JP) ..................................... 437/922

OTHER PUBLICATIONS

B.K. Aggrawal, IBM Tech. Discl. Bulletin, 21(8) (679) 3271 "Laser Programmable Variable Valve Resistor".*
S.S. Cohen, et al., J. Electrochem. Soc., 138(10) (1991) 3013 "The Mechanism of Laser–Induced Vertical Links".*
S.S. Cohen, et al., IEEE Trans. Electron. Dev., 39(11) (1992) 2480 "Laser Induced Line Melting and Cutting".*
R.A. Lee et al., GOMAC 1993 Proc., 81–84 "Laser Programmable interconnects for Quick Turn Around . . .".*
High–Density Laser Linking of Metal Interconnect, Dec. 1994 J. Bernstein, T. Ventura and A. Radomski, 390–393.
S.S. Cohen et al., "The Mechanism of Vertical Induced Links," J. Electrochem. Soc. 138 (10) pp. 3013–3018, Oct. 1991.*

* cited by examiner

Primary Examiner—Charles Bowers
Assistant Examiner—Keith Christianson
(74) Attorney, Agent, or Firm—Holland & Knight LLP

(57) ABSTRACT

A method for producing an interconnect from a first metal trace, through a dielectric, to a second metal trace. The method comprises the steps of heating a portion of the first metal trace to cause thermal expansion and at least partial melting thereof and heating a portion of the second metal trace to cause thermal expansion and at least partial melting thereof such that the thermal expansion of the traces causes at least one crack or fissure in the dielectric to be formed between the traces and such that the melting of the traces causes the metals to fuse together through the crack or fissure, thereby producing the interconnect from the first metal trace to the second metal trace. One of the metal traces may comprise a substantially square donut shape configuration having four interior edges portions, wherein the probability of a successful interconnection is increased due to the increased number of edges present on the top layer from which a crack or fissure to the lower layer can form.

3 Claims, 7 Drawing Sheets

LASER-PROGRAMMABLE INTERCONNECT PROCESS FOR INTEGRATED CIRCUIT CHIPS

This is a continuation of patent application Ser. No. 08/389,892, filed on Feb. 16, 1995, now abandoned.

The invention was made with Government support under contract number MDA904-93-c-4100 awarded by the Department of Defense. The Government has certain rights in the invention.

BACKGROUND OF THE INVENTION

1. Field of the Invention

This invention relates to laser-programmable electronic circuits. More particularly, this invention relates to laser-programmable electronic circuits fabricated using standard very large scale integration (VLS) process techniques.

2. Description of the Background Art

Microelectronic components constitute a major portion of the actual functioning elements of an electronic system. Integrated circuits (ICs) allow the unique functional elements of an electronic system to be realized. Thus, a large part of the cost and time associated with developing new electronic systems is the effort associated with developing new and unique ICs. Development costs can easily approach hundreds of thousands of dollars for each new IC designed and fabricated. Also, considering the fabrication of the ICs as well as design revisions after testing the newly-fabricated ICs, development times can be on the order of months. Hence, a significant problem facing the electronics industry is the cost and time associated with developing electronic systems and, in particular, ICs.

Programmable ICs have been developed to minimize the cost and time associated with developing customized ICs. Basically, programmable ICs are ICs that have been fabricated in generic yet programmable configurations. The programmability of a programmable IC thus allows customization in a rapid and cost-efficient manner. Specifically, cost effectiveness is achieved since the development cost of the programmable IC has been previously incurred and amortized across the volume of the programmable ICs produced and sold to various developers. The programming of the ICs typically may be done in a very short time relative to full custom-developed ICs.

Presently, there exist many different types of programmable ICs. A large class comprises programmable gate arrays (PGAs). PGAs have redundant logic gate elements distributed throughout the IC. Programming of a PGA occurs by connecting the logic elements into specific functional groups. The type of connection and the way that the connection is made varies among different vendors of PGAs. Many types of PGAs are user-programmable, and are generally referred to as field programmable gate arrays (FPGAs). FPGAs may be software-programmable whereas others are hard-programmable.

Software-programmable FPGAs use software-controllable switching elements, often referred to as programming elements, to direct the signal flow to various gates, thereby creating specific functional groups. One attribute of software-programmable FPGAs is that they can often be programmed after insertion into the developed electronic product. Also, reprogramming of the FPGA may occur without removing the FPGA from the electronic product. Unfortunately, however, software-programmable switching elements, such as pass transistors, consume considerable space on the IC, thereby limiting the number of gates that may be fabricated per a given IC die area.

In hardware-programmable FPGAs, the programming elements are typically "anti-fuse" elements composed of a highly-resistive material alloy that does not serve as a signal path. During programming, a high voltage is placed across the anti-fuse element to cause it to melt and form a conductive link at the interconnect, usually on the order of hundreds of ohms.

A more complete disclosure of FPGAs may be found in *Field-Programmable Gate Arrays*, authored by Stephen D. Brown, et al., and published by Kluwer Academic Publishers in 1992, the disclosure of which is hereby incorporated by reference herein. As set forth in *Field-Programmable Gate Arrays*, both hardware-programmable and software-programmable FPGAs are commercially available by a number of vendors, and have enjoyed significant commercial success. Unfortunately, however, as noted above, in software-programmable FPGAs, considerable chip area is required for the programmable elements and, in hardware-programmable FPGAs, the material alloys constituting the anti-fuse programmable element, requires specialized chip fabrication techniques.

More recently, PGAs have been developed that include programming elements that may be programmed by means of a laser. Representative laser-programmable PGAs are disclosed in the following United States Patents, the disclosures of each of which are hereby incorporated by reference herein:

| | |
|---|---|
| 4,240,094 | Laser-Configured Logic Array |
| 4,455,495 | Programmable Semiconductor Integrated Circuitry Including a Programming Semiconductor Element |
| 4,665,295 | Laser Make-Link Programming of Semiconductor Devices |
| 4,872,140 | Laser Programmable Memory Array |
| 4,910,418 | Semiconductor Fuse Programmable Array Structure |
| 4,937,475 | Laser Programmable Integrated Circuit |
| 5,049,969 | Customizable Semiconductor Devices |

More particularly, in U.S. Pat. No. 4,420,094, there is disclosed a laser-programmable logic array that employs laser technology to selectively tailor individual logic elements of which the building blocks of a large-scale integrated circuit (LSI) array may be configured and to selectively interconnect such laser-configured building blocks.

In U.S. Pat. No. 4,665,295, there is disclosed a laser-programmable semiconductor device that causes an electrical short between two conductors on a silicon substrate by melting the insulator between the conductors and fusing or shorting the conductors to a metal pad, thereby shorting or fusing the conductors together. Unfortunately, however, the necessity for the metal pad requires that specialized chip fabrication techniques be employed, thereby significantly increasing the cost of fabricating the semiconductor device.

In U.S. Pat. No. 4,872,140, there is disclosed a laser-programmable memory array that employs laser-fusible links. Similarly, in U.S. Pat. No. 4,937,475, there is disclosed a laser-programmable IC that employs laser-diffusible links composed of two back-to-back diodes that are separated by a gap of a few microns. Interconnection is accomplished by aiming a laser at the gap between the dopant regions of the diodes such that the dopant is caused to redistribute into the gap creating the interconnection. This technology has become known as "Lateral Diffused Link" (LDL) and has been employed at the wafer level in restructuring wafer scale integration (WSI) systems. Unfortunately, however, while LDL has been shown to be reproducible with high yield and good reliability, the resistance values of the interconnection are on the order of hundreds of ohms and some linkage to the substrate is sometimes experienced. Most importantly, LDL processes are limited to in-plane interconnects and, therefore, do not allow for vertical interconnections between adjacent layers of the IC. Further, it should be appreciated that the programmable ICs taught by both of these patents mandate specialized chip fabrication techniques in order to create the programmable links.

Therefore, it is an object of this invention to provide an improvement that overcomes the aforementioned inadequacies of the prior art devices and provides an improvement that is a significant contribution to the advancement of the laser-programmable IC art.

Another object of this invention is to provide an apparatus and method for producing an interconnect from a first metal trace, through a dielectric, to a second metal trace, comprising the steps of heating a portion of the first metal trace to cause thermal expansion thereof and at least partial melting of metal constituting the portion of the first metal trace and heating a portion of the second metal trace to cause thermal expansion thereof and at least partial melting of metal constituting the portion of the second metal trace such that the thermal expansion of the portions causes at least one crack in the dielectric to be formed between the portion of the first metal trace and the portion of the second metal trace and such that the melting of the metals of the portions of the first metal trace and the second metal trace causes the metals to fuse together through the crack, thereby producing the interconnect from the first metal trace to the second metal trace.

Another object of this invention is to provide an apparatus and method as set forth above, wherein the portion of the first metal trace comprises an edge portion of the first metal trace that overlaps the portion of the second metal trace and wherein the steps of heating the portions of the metal traces to cause thermal expansion thereof occur simultaneously by projecting at least one beam of electromagnetic energy simultaneously onto the edge portion of the first metal trace and onto the portion of the second metal trace.

Another object of this invention is to provide an apparatus and method as set forth above, wherein the first metal trace is positioned above the second metal trace, wherein the metal of the first metal trace flows downwardly at least partially into the crack toward the second metal trace, and wherein the metal of the second metal trace flows upwardly at least partially into the crack toward the first metal trace.

Another object of this invention is to provide an apparatus and method as set forth above, wherein the first metal trace comprises, in part, a substantially square donut shape configuration defining four interior edge portions, wherein the portion of the first metal trace comprises the four interior edge portions and wherein the beam is projected simultaneously onto the four interior edge portions of the first metal trace and onto the portion of the second metal trace.

The foregoing has outlined some of the pertinent objects of the invention. These objects should be construed to merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises an apparatus and method for creating interconnects between metal traces of an IC through the use of a laser. Importantly, the apparatus and method of the subject invention are employable in conventionally-fabricated ICs composed of metal traces separated by standard dielectrics, such as phosphor-silicate glass (PSG). The need for specialized IC fabrication processes as required by prior art laser-programmable IC processes is therefore eliminated.

The apparatus and method of the invention may be employed vertically to interconnect first (upper) metal trace through a dielectric layer to second (lower) metal trace. The apparatus and method of the invention may also be employed horizontally to interconnect a first metal trace through a dielectric to a second metal trace, the metal traces and the dielectric being positioned in the same plane. Consequently, while this Summary of the Invention and the following Detailed Description of the Preferred Embodiment emphasizes vertical interconnections for convenience and clarity in wording, it shall be understood that the teachings herein may also be applied to horizontal interconnections without departing from the spirit and scope of this invention.

More particularly, the apparatus and method of the subject invention produce a low-resistance interconnect from the edge(s) of an upper metal trace, through the standard dielectric of the IC separating the metal traces, to a lower metal trace. Basically, the method comprises aiming a short pulse of a laser beam at the edge of the upper metal trace and onto the lower metal trace therebeneath such that the metal traces are rapidly heated. Upon thermal expansion of the metal traces, the dielectric between the metal traces is cracked. Simultaneously or subsequently to the cracking of the dielectric, the metal traces become at least partially molten. Upon melting, the upper metal trace flows through the crack in the dielectric and melts into the lower metal trace, thereby forming an integral or soldered contact between the metal traces.

The method of the subject invention is employed at one or more of the edges of the upper metal trace so that the laser beam is simultaneously focused onto such edge of the upper metal trace and onto the lower metal trace. In this manner, both metal traces are simultaneously heated during lasing. Being simultaneously heated during lasing, both metal traces simultaneously thermally expand. The simultaneous thermal expansion of the metal traces causes the dielectric therebetween to crack. While some nominal melting of the dielectric adjacent to the metal traces may occur, it is the cracking of the dielectric from one metal trace to the other that makes it possible for the molten upper metal trace to flow through the crack and bond with the molten lower metal trace. After lasing, the molten metal rapidly cools to a solid state. A low resistance interconnect is therefore formed in the crack between the metal traces.

Preferably, at the area of overlap of the intended interconnect with the lower metal trace, the upper metal trace is configured in a square donut shape configuration with a square center hole. The diameter of the focused laser beam spot is selected to be appreciably greater than the width of the square center hole to overlap the four edges of the square hole when centered therewith. To create the interconnect, the laser beam is aimed at the center of the square hole so that the four edges of the square hole, and the lower metal trace beneath the square hole, are all simultaneously lased. The dielectric is ideally cracked beneath the four edges of the upper metal trace and ideally four interconnects between the upper and lower metal traces are formed. In this manner, should up to three of the intended cracks fail to be properly formed, an adequate interconnect is still achieved via the fourth crack.

In another variation to the method of the invention, the opposing edges of the upper metal trace overlapping the lower metal trace may be lased in separate steps. In this manner, cracks in the dielectric and the resulting interconnects may be separately formed from opposing edges of the upper metal trace to the lower metal trace. In the event one interconnect fails to form, the other nevertheless achieves an adequate low resistance interconnect between the metal traces.

In still another variation of the method of the invention, one (or all) of the edges of the upper metal trace that overlaps the lower metal trace may be lased by a narrower laser beam at adjacent spots along the length of such edge. In this manner, a plurality of cracks and the resulting interconnects are formed along the length of such edge. Individually or cumulatively, the plurality of interconnects along such edge achieves a low resistance interconnect between the upper and lower metal traces.

Importantly, experimentation employing the LVL interconnects according to the subject invention as summarized above, has proven that an interconnect resistance below 10 ohms has been achieved. Further, yield values of 97%, or higher have been achieved.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
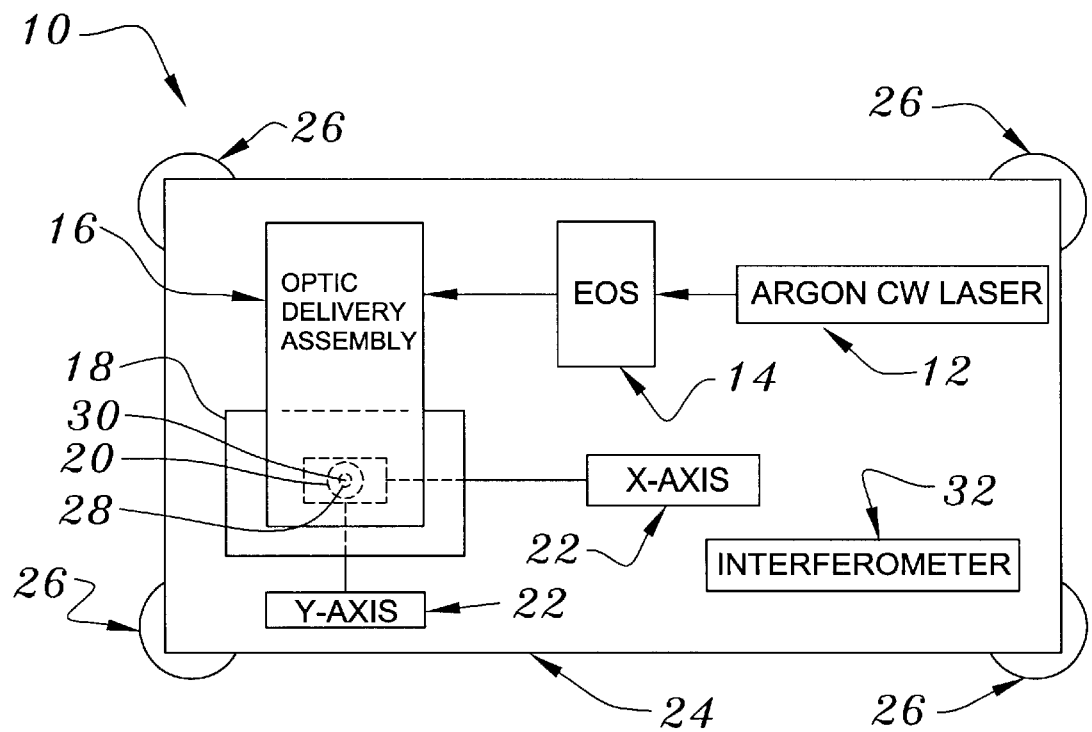
FIG. 1 is a block diagram illustrating the manner in which conventional system components may be assembled to perform the method of the invention.

FIG. 1 illustrates the laser system, generally indicated by numeral 10, for achieving the apparatus and method of the subject invention. The laser system includes a high energy 5 watt Argon Cbt laser 12, an electro-optic shutter (EOS) 14, an optic delivery assembly 16, a tilt/rotation assembly 18, a Z-axis stepper motor assembly 20, and a high-precision X-Y translation assembly 22. The system components are mounted on a two ton granite table 24 installed on four self-levelling pneumatic legs 26 for a vibration-free process environment.

Figure 1A:
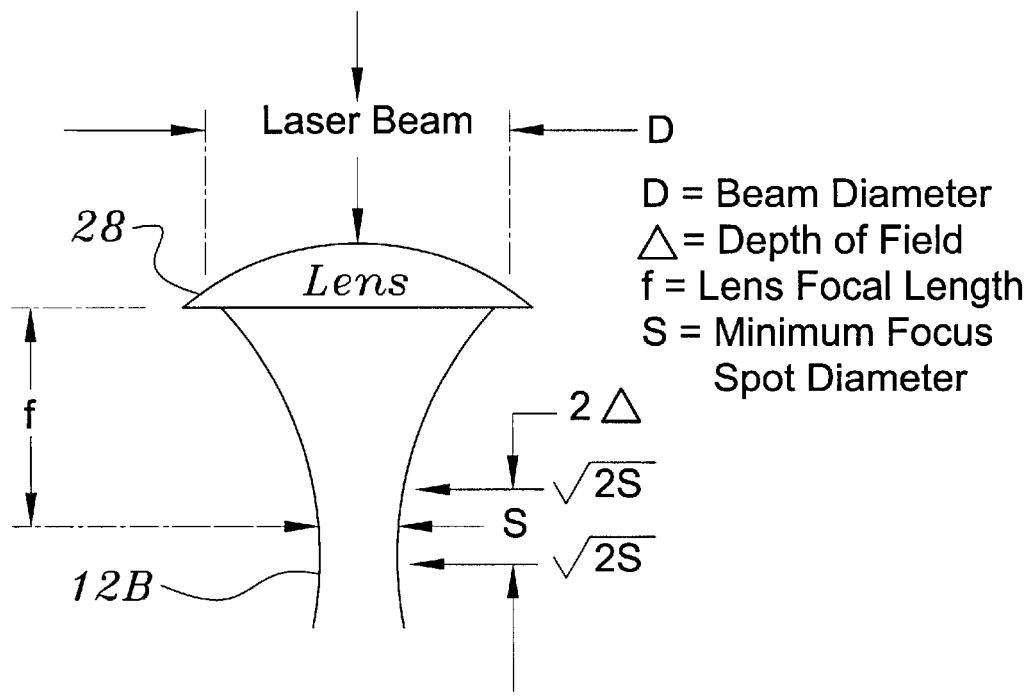
FIG. 1A is a diagrammatic view of an objective lens employed for laser beam focusing.

More particularly, the laser beam from the CW laser 12 is operatively pulsed by the EOS 14 and is guided through the optic delivery assembly 16 where the laser beam is focused down, by means of a 50× objective lens 28, to a minimum focused spot size on the order of 2 $\mu$m and 3 $\mu$m and a depth of field on the order of 1 $\mu$m to 2 $\mu$m (see FIG. 1A) The focused laser beam 12B is directed to a packaged IC chip or wafer 30 mounted on the tilt/rotation stage assembly 18 for IC leveling and alignment. The tilt/rotation stage assembly 18 is, in turn, mounted on the Z axis stage assembly 20 that comprises a stepper motor and an optical encoder combination with a resolution of 0.1 $\mu$m allowing fine laser focusing. The X-Y translation assembly 22 employs linear DC motors for X-Y precision control. A laser interferometer 32 is provided for position feedback. A video camera system (not shown) may be employed to observe the surface of the IC 30, and a relay-actuated blocking shutter (not shown) may be utilized for safety. A digital multimeter (not shown) may be positioned in line for testing purposes. Controllers (not shown) are connected via IEEE-488 or other interfaces to the EOS 14, tilt/rotation stage assembly 18, Z axis stepper motor assembly 20, CW laser 12 and the X-Y translation assembly 22 for controlling the operation thereof. Appropriate software for the controllers is provided for achieving the apparatus and method of the invention as described below.

It is noted that the system components described above have been utilized in laboratory experimentation and analysis of the subject invention. Without departing from the spirit and scope of this invention, it should be readily appreciated that similar system components may be utilized to accomplish the apparatus and method of the subject invention in a commercial environment on a production basis.

Figure 2:
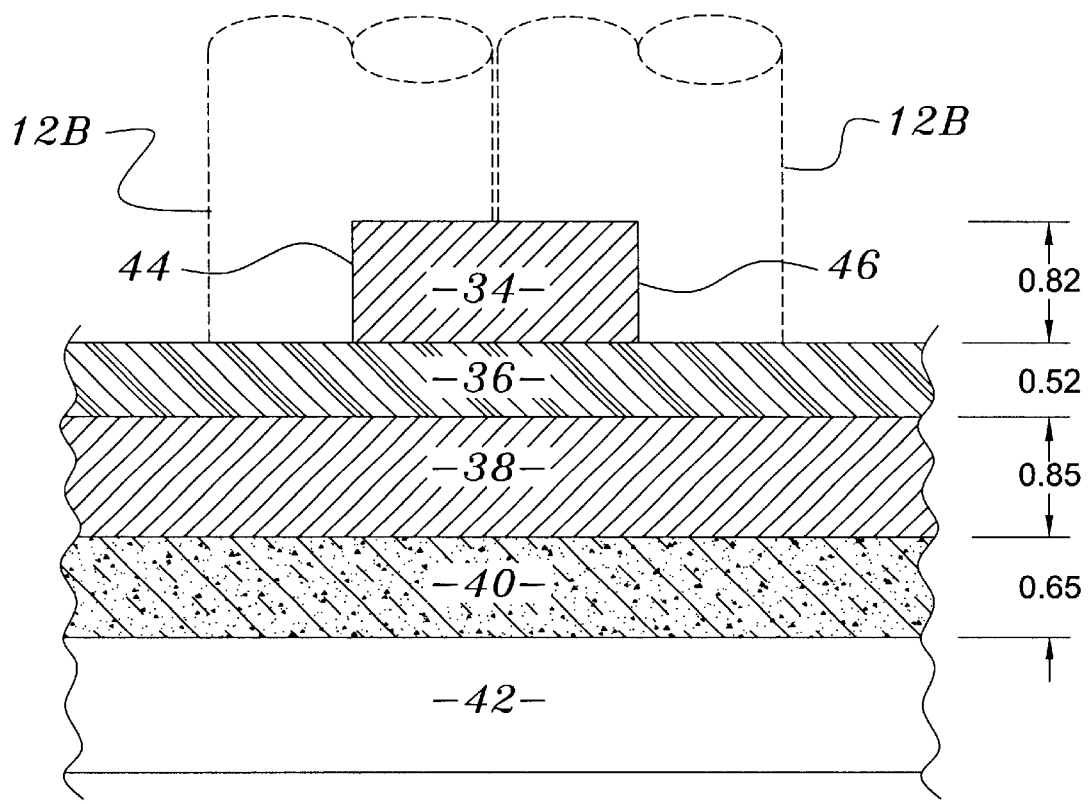
FIG. 2 is a partial cross-sectional view of an IC illustrating an area of an interconnect to be formed between an upper metal trace and a lower metal trace, with the metal traces overlapping each other.

Referring now to FIG. 2, it is seen that a conventional IC 30 comprises in layers: an upper metal trace 34, a dielectric 36, a lower metal trace 38, a base layer 40, and a substrate layer 42. Conventionally, the upper metal trace 34 is composed of an aluminum alloy, the dielectric 36 is composed of PSG, the lower metal trace is composed of layered titanium and wolfram (tungsten) and the base layer 40 is composed of field oxide. FIG. 2 illustrates the conventional thicknesses of various the layers 34–42.

Figure 3:
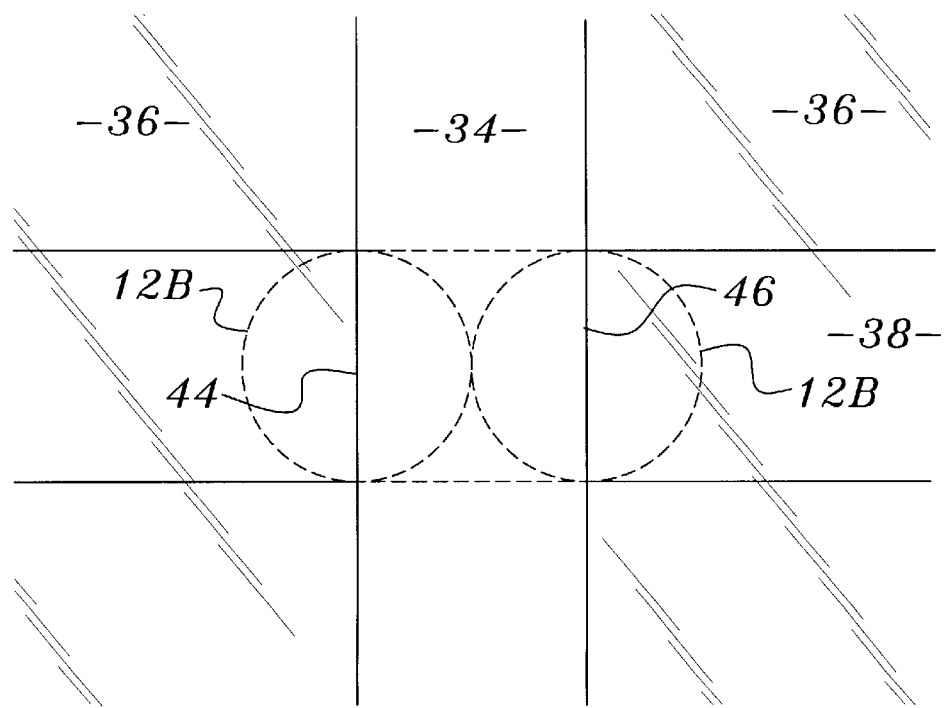
FIG. 3 is a top plan view of FIG. 2 illustrating the upper metal trace overlapping the lower metal trace that is to be interconnected at its opposing edges to the lower metal trace, with positioning of the focused laser beam spot at the opposing edges being shown in phantom.

As shown in FIG. 3, which is a top plan view of FIG. 2, the metal traces 34 and 38 typically comprise overlapping signal traces of the IC 30. Laser programming of the IC 30 is accomplished by selectively interconnecting the metal trace 34 and 38 to form the customized IC 30. It should be appreciated that the apparatus and method of the subject invention may be applied to all of the various programmable IC configurations and methodologies without departing from the spirit and scope of the present invention.

As shown in FIG. 3, the upper metal trace 34 includes opposing first and second edges 44 and 46 that overlap the lower metal trace 38 positioned therebelow. It is one or both of these edges 44 and 46 of the upper metal trace 34 which is electrically interconnected to the lower metal trace 38 according to the apparatus and method of this invention. Specifically, as shown in FIG. 3, in one embodiment, the focused laser beam 12B (from the CW laser 12 and lens 28) is centered at the midpoint of the edges 44 and 46 such that one-half of the focused laser beam 12B lases the edge 44 or 46 of the upper metal trace 34 and the other half of the focused laser beam 12B lases the lower metal trace 38. It is noted that the dielectric 36 is essentially transparent to the focused laser beam 12B.

Figure 4:
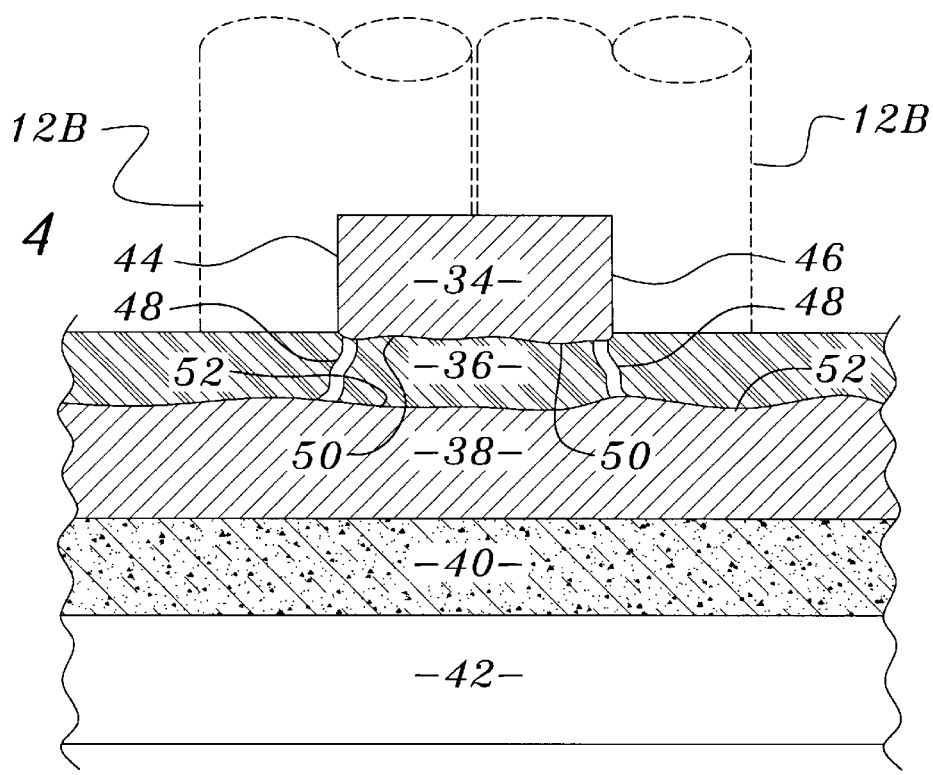
FIG. 4 is a partial cross-sectional view of the IC of FIG. 2 illustrating the cracks in the dielectric that are created by the thermal expansion of the metal traces upon lasing.

As shown in FIG. 4, upon being lased, the edges 44 and 46 of the upper metal trace 34 and the lower metal trace 38 are heated and therefore are caused to thermally expand. Upon expanding, the dielectric 36 positioned between the metal trace 34 and 38 is squeezed to form a crack 48. Crack 48 extends through the entire thickness of the dielectric 36 from the bottom surface of the edge 44 or 46 of the upper metal trace 34 to the top surface 52 of the lower metal trace 38. In this regard, it is noted that crack 48 may comprise a single crack of significant width as shown, or a plurality of fine cracks. In any event, it should be appreciated that the cracking of the dielectric 38 creates a fluid communication passageway between the bottom surface 50 of the upper metal trace 34 and the top surface 52 of the lower metal trace 38.

Figure 5:
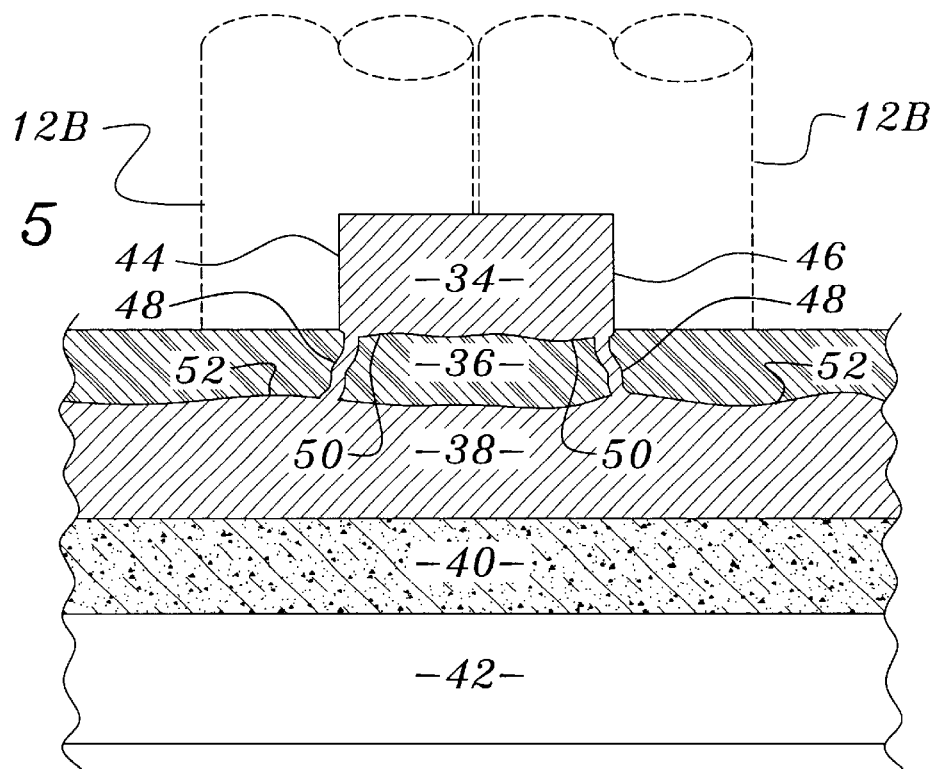
FIG. 5 is another partial cross-sectional view of the IC of FIG. 2 illustrating the crack (formed as shown in FIG. 4), filled with a molten portion of the metal from the upper metal trace that forms a metal interconnect with the partially molten lower metal trace.

As shown in FIG. 5, simultaneously or subsequently to the forming of the crack 48 in the dielectric 36, the lasing of the metal traces 34 and 38 causes partial melting of them. Upon melting of the upper metal trace 34, molten metal therefrom flows into and through crack 48 to the molten metal of the lower metal trace 38. It is expected that some of the molten metal from the lower metal trace 38 may flow, by capillary action, upwardly into the crack 48 to join with the molten metal of the upper metal trace 34. In any event, experiments have proven that a solid interconnecting flow of metal occurs within the crack 48 between the metal traces 34 and 38.

While some melting of the dielectric 36 may occur during lasing, the power level of the laser 12, the manner in which it is focused, and its duration, are optimally selected to achieve the cracking of the dielectric 36 and at least a partial melting of the metal traces 34 and 38 sufficient to flow through the crack 48 and join together, thereby creating the interconnect. It is contemplated that a single pulse of the focused laser beam 12B of sufficient duration would achieve the interconnect; however, it should be appreciated that multiple pulses of shorter durations may alternatively be employed without departing from the spirit and scope of this invention.

As noted above, it should be appreciated that both of the opposing edges 44 and 46 of the upper metal trace 34 may be independently lased to as to form opposing cracks 48 in the dielectric 36 and create an interconnect between the metal traces 34 and 38 therein. In this manner, the reliability of achieving an interconnect between the metal traces 34 and 38 is increased.

Figure 6:
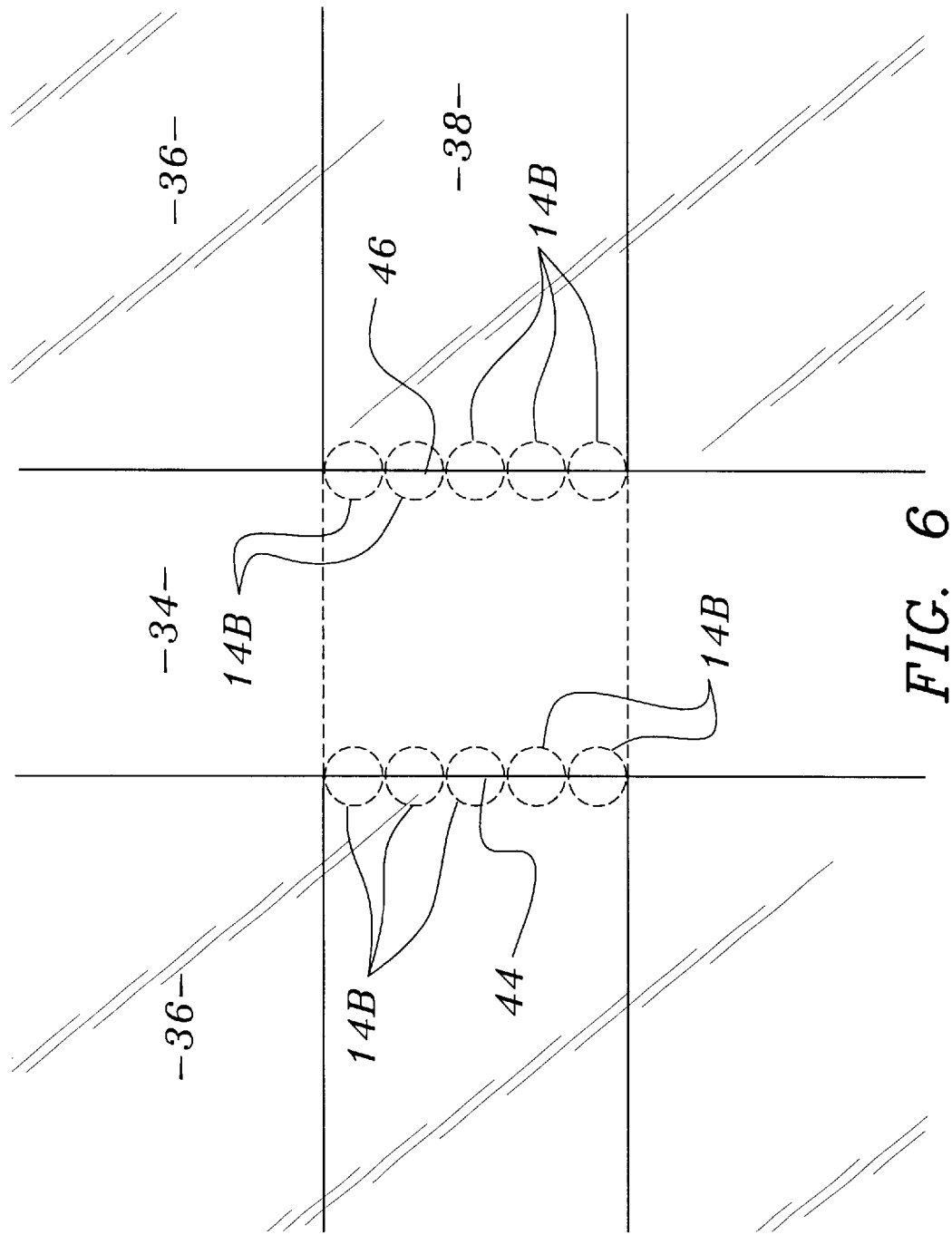
FIG. 6 is a top view illustrating the manner in which one or both of the opposing edges of the upper metal trace may be lased by a plurality of adjacent narrow laser beams along the length of such edge.

As shown in FIG. 6, one or both of the opposing edges 44 and 46 of the upper metal trace 34 may be lased by a plurality of adjacently-aligned narrow focused laser beam spots 12B positioned along the length of the edge 44 or 46. The narrow beam lasing of the edge 44 or 46 results in smaller cracks 48 being formed in the dielectric 36 and therefore result in smaller interconnects. While the smaller interconnects individually would have a greater resistance, the smaller interconnects would effectively be connected in parallel and therefore would have a smaller cumulative interconnection resistance. Moreover, should one or more of the smaller interconnects inadequately form, the remaining interconnect(s) of a higher resistance may still satisfactorily achieve an adequate interconnect. Hence, the likelihood of an inoperative (open circuit) interconnect is minimized.

Figure 7:
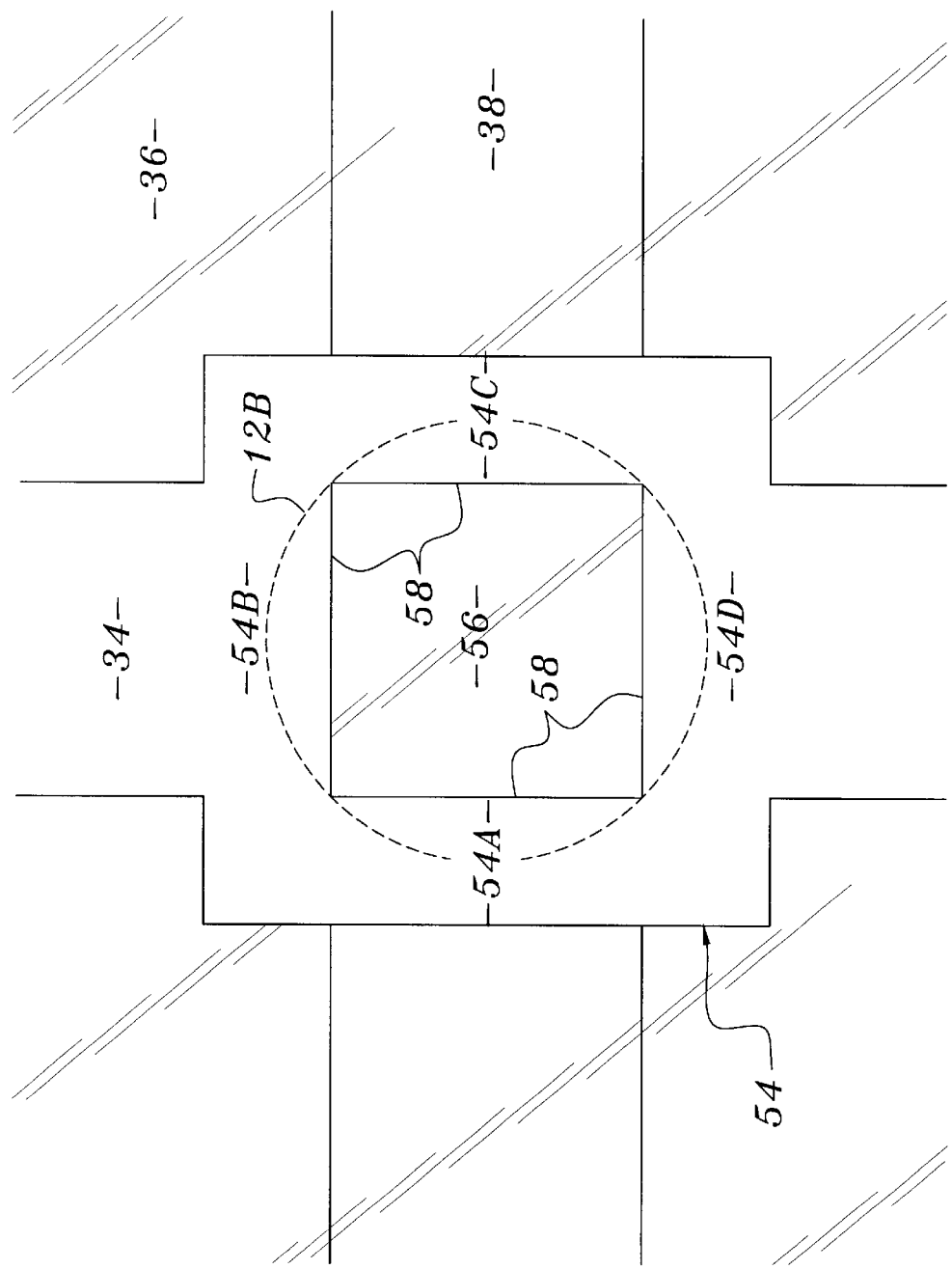
FIG. 7 is a top plan view illustrating the preferred configuration of the area of the upper metal trace that overlaps the lower metal trace that is to be interconnected therewith.

FIG. 7 illustrates the preferred configuration of the area of the upper metal trace 34 that overlaps the lower metal trace that is to be interconnected therewith. More particularly, such preferred configuration comprises a square doughnut-shaped configuration 54 composed of four segments 54A, 54B, 54C and 54D that define a square center hole 56. The width of the square center hole 56 is preferably substantially equal to the width of the upper metal trace 34. Correspondingly, the width of each of the four segments 54A–D of the square doughnut-shaped configuration 54 is preferably substantially equal to one-half the width of the upper metal trace 34. With such dimensions, it is seen that there exists four interior edges 58 defined by the square doughnut-shaped configuration 54 about the center hole 56 that overlap the lower metal trace 38.

As shown in phantom in FIG. 7, the diameter of the focused laser beam 12 is selected to be appreciably greater than the width of the center hole 56 such that a substantial portion or all of each of the four interior edges 58 is lased. It should therefore be appreciated that, upon lasing, each of the four interior edges 58 are simultaneously lased as well as the area of the lower metal trace 38 immediately below the center hole 56 of the upper metal trace 34. In this manner, four cracks 48 are simultaneously formed in the dielectric 36 proximate to the four interior edges 58. Upon the melting of the metal, four interconnects between the metal traces 34 and 38 are simultaneously formed. Since any one of the four interconnects is sufficient to achieve a low resistance interconnect between the layers 34 and 38, it should be appreciated that the preferred configuration of the overlapping area as described above results in a significant increase in yield. Further, if four good interconnects are achieved, they are connected in parallel, thereby resulting a significantly reduced overall interconnect resistance.

A more complete description and analysis of the subject invention, particularly with regard to the preferred configuration discussed above, can be found in the dissertation entitled "Laser Direct Routing for High Density Interconnects" authored by one of the co-inventors hereof, Wilfrido A. Moreno, and published by the University of South Florida Library on Jul. 15, 1994 (card catalog TK 145.Z9 M67 1993), the disclosure of which is hereby incorporated by reference herein.

As set forth in such dissertation, optimal interconnect resistance below 10 ohms and yield values of 97% were statistically achieved by employing the following parameters:

| IC Layers Compositions & Thicknesses | See FIG. 2 |
|---|---|
| Width of Metal traces | 2 $\mu$m |
| Center Hole | 2 $\mu$m square |
| Width of Square Doughnut Segments | 1 $\mu$m |
| Laser Power | 0.6 watts |
| Laser Minimum Focus Spot Diameter | 3 $\mu$m |
| Laser Pulse Duration | 1 $\mu$sec |
| Number of Laser Pulses | 1 |

It is noted that for a given IC 30, the laser power, pulse duration, and number of pulses principally determine the efficacy of the subject invention in achieving low resistance interconnects at high yields. In contrast, the depth of field, the focal length, and minimum focus spot diameter parameters have less effect.

Subsequent to the dissertation noted above, it has been realized that the heat sinking capacity of the upper metal trace 34 significantly affects the efficacy of the subject invention. More particularly, still referring to FIG. 7, it has been determined that greater cracking of the dielectric 36 occurs at segments 54A and 54C than what occurs at segments 54B and 54D of the upper metal trace 34. Therefore, better interconnection is achieved at the interior edges 58 of segments 54A and 54C than at the edges 58 of segments 54B and 54D. It is believed that the remaining portions of the upper metal trace 34 connected to segments 54B and 54D function as heat sinks to such segments 54B and 54D. Therefore, it appears that during lasing, segments 54A and 54C are heated and thermally expanded more rapidly causing greater cracking than what occurs at segments 54B and 54D due to such heat sinking at such segments 54B and 54D.

Figure 8:
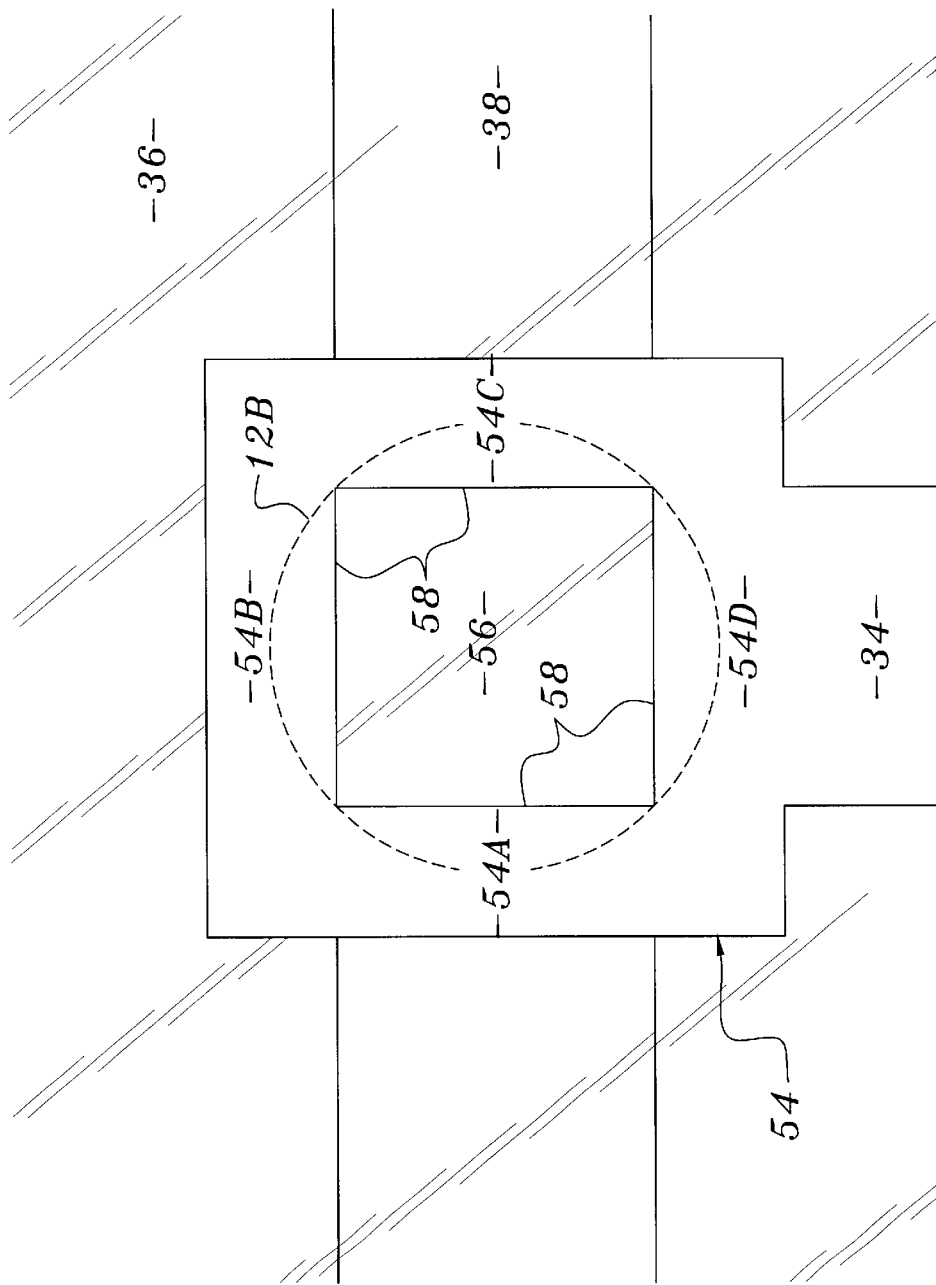
FIG. 8 is a top plan view illustrating a modified preferred configuration of the upper metal trace that overlaps the lower metal trace and is to be interconnected therewith.

It is noted that the apparatus and method of the subject invention may be employed at any overlapping intersection of upper and lower metal traces 34 and 38. Specifically, as shown in FIG. 8, it is seen that the subject invention may be employed in topology where the upper metal trace 34 dead-ends or terminates above the lower metal trace 38 (or vice versa).

Figure 9:
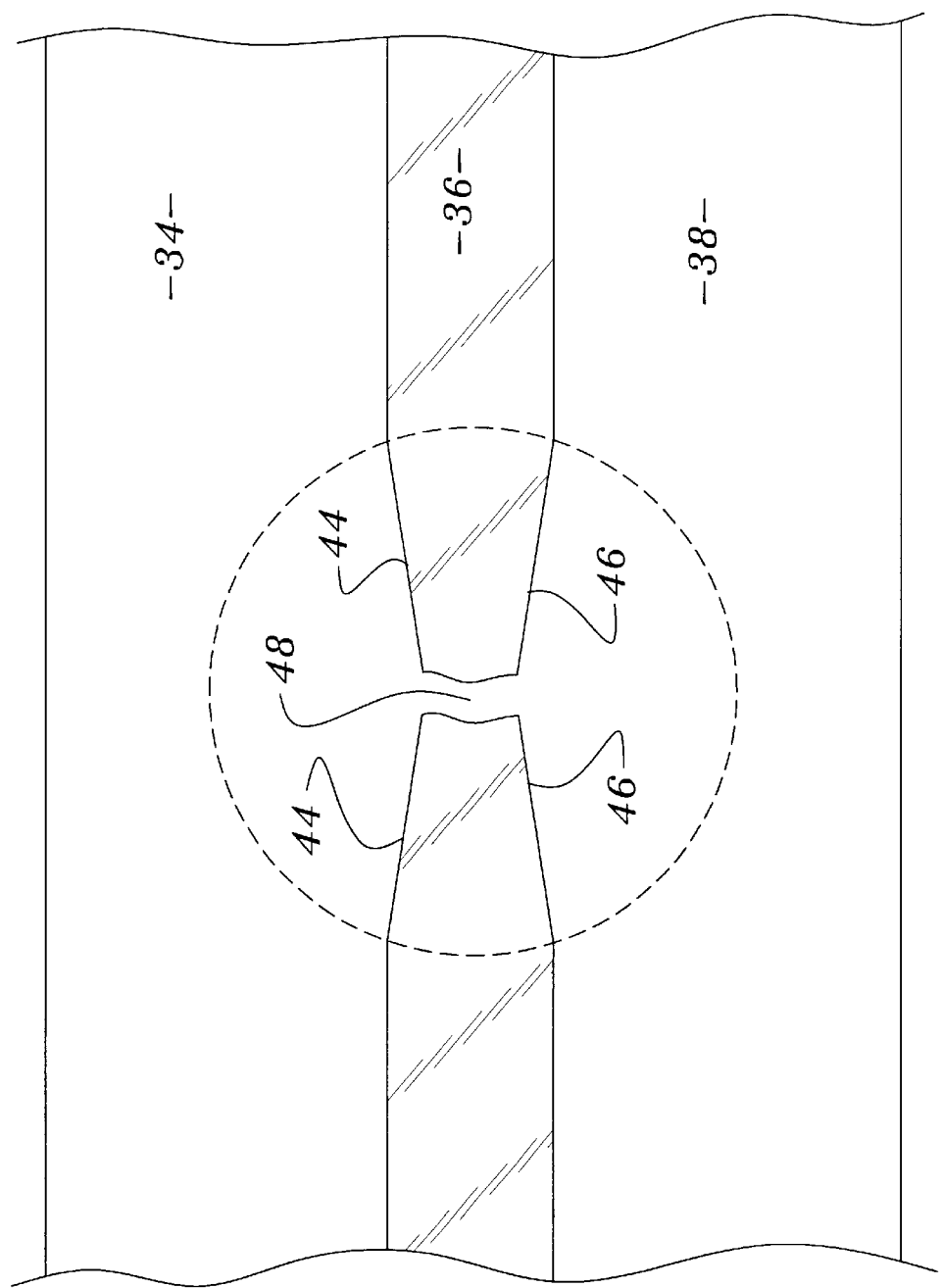
FIG. 9 is a top plan view of two metal traces positioned in the same plane and horizontally interconnected according to the apparatus and method of this invention.

Finally, it is again noted that the apparatus and method of the subject invention as described above have emphasized vertical interconnection. However, as shown in FIG. 9, the apparatus and method of the subject invention are equally employable to produce horizontal interconnections between in-plane metal traces 34 and 38 separated by a dielectric 36. Specifically, interconnection between the metal traces 34 and 38 may be formed by focusing the focused laser beam 12B to overlap the facing edges 44 and 46 of the metal traces 34 and 38 so as to simultaneously heat both of the facing edges 44 and 46. Upon heating, the facing edges 44 and 46 thermally expand and crack the dielectric 36 therebetween. Molten metal from the facing edges 44 and 46 flows into the crack 48 to fuse together. An interconnect between the metal traces 34 and 38 is therefore formed.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method for producing an interconnect from a first metal trace, through a dielectric, to a second metal trace, comprising the steps of heating a portion of the first metal trace to cause thermal expansion thereof and at least partial melting of metal constituting the portion of the first metal trace and heating a portion of the second metal trace to cause thermal expansion thereof and at least partial melting of metal constituting the portion of the second metal trace such that the thermal expansion of the portions causes at least one crack in the dielectric to be formed between the portion of the first metal trace and the portion of the second metal trace and such that the melting of the metals of the portions of the first metal trace and the second metal trace causes the metals to fuse together through the crack, thereby producing the interconnect from the first metal trace to the second metal trace, and the first metal trace comprising, in part, a substantially square donut shape configuration defining four interior edge portions with the portion of the first metal trace comprising the four interior edge portions.

2. The method as set forth in claim 1, wherein the steps of heating the portions of the metal traces to cause thermal expansion thereof occur simultaneously.

3. The method as set forth in claim 2, wherein the steps of simultaneously heating the portions of the metal traces comprise the step of projecting at least one beam of electromagnetic energy simultaneously onto the four interior edge portions of the first metal trace and onto the portion of the second metal trace.

* * * * *